US007944143B2

(12) United States Patent
Choi et al.

(10) Patent No.: US 7,944,143 B2
(45) Date of Patent: May 17, 2011

(54) ORGANIC LIGHT-EMITTING DISPLAY DEVICE WITH FRIT SEAL AND REINFORCING STRUCTURE BONDED TO FRAME

(75) Inventors: Dong Soo Choi, Yongin-si (KR); Dae Ho Lim, Yongin-si (KR); Jae Sun Lee, Yongin-si (KR); Jin Woo Park, Yongin-si (KR); Jong Woo Lee, Yongin-si (KR); Ung Soo Lee, Yongin-si (KR); Sang Wook Sin, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 982 days.

(21) Appl. No.: 11/540,151

(22) Filed: Sep. 29, 2006

(65) Prior Publication Data

US 2007/0170860 A1 Jul. 26, 2007

(30) Foreign Application Priority Data

Jan. 25, 2006 (KR) ........................ 10-2006-0007893

(51) Int. Cl.
*H01J 1/62* (2006.01)
*H05B 33/00* (2006.01)

(52) U.S. Cl. ........................................................ 313/512

(58) Field of Classification Search ........... 313/498–512
See application file for complete search history.

(56) References Cited

U.S. PATENT DOCUMENTS

| | | | |
|---|---|---|---|
| 3,966,449 | A | 6/1976 | Foster |
| 4,004,936 | A | 1/1977 | Powell |
| 4,105,292 | A | 8/1978 | Conder et al. |
| 4,702,566 | A | 10/1987 | Tukude |
| 4,826,297 | A | 5/1989 | Kubo et al. |
| 4,984,059 | A | 1/1991 | Kubota et al. |
| 5,808,719 | A | 9/1998 | Fujiwara et al. |
| 5,811,927 | A | 9/1998 | Anderson et al. |
| 5,965,907 | A | 10/1999 | Huang et al. |
| 6,005,653 | A | 12/1999 | Matsuzawa |
| 6,087,717 | A | 7/2000 | Ano et al. |

(Continued)

FOREIGN PATENT DOCUMENTS

| | | | |
|---|---|---|---|
| CN | 1290121 | A | 4/2001 |

(Continued)

OTHER PUBLICATIONS

Japan Office Action dated Jul. 28, 2009 of the Japanese Patent Application No. 2006-153567.

(Continued)

*Primary Examiner* — Joseph L Williams
(74) *Attorney, Agent, or Firm* — Knobbe Martens Olson & Bear LLP

(57) ABSTRACT

Disclosed is an organic light-emitting display device in which a substrate and an encapsulation substrate are joined by a frit and a reinforcing structure. The first substrate has a pixel region in which an organic light-emitting diode is formed, and a non-pixel region formed outside the pixel region. The second substrate is attached the first substrate by the frit. A bracket is joined with substrates by the reinforcing structure. A curable material is applied to inside the frame, moves between the first and second substrates, and then cured to form the reinforcing structure.

25 Claims, 6 Drawing Sheets

U.S. PATENT DOCUMENTS 6,195,142 B1 2/2001 Gyotoku et al.
6,210,815 B1 4/2001 Ooishi
6,211,938 B1 4/2001 Mori
6,288,487 B1 9/2001 Arai
6,424,009 B1 7/2002 Ju
6,452,323 B1 9/2002 Byrum et al.
6,489,719 B1 12/2002 Young et al.
6,495,262 B2 12/2002 Igeta
6,515,417 B1 2/2003 Duggal et al.
6,551,724 B2 4/2003 Ishii et al.
6,554,672 B2 4/2003 Dunham et al.
6,565,400 B1 5/2003 Lee et al.
6,590,337 B1 7/2003 Nishikawa et al.
6,603,254 B1 8/2003 Ando
6,605,826 B2 8/2003 Yamazaki et al.
6,624,572 B1 9/2003 Kim et al.
6,646,284 B2 11/2003 Yamazaki et al.
6,650,392 B2 11/2003 Iwangaga et al.
6,660,547 B2 12/2003 Guenther
6,671,029 B1 12/2003 Choi
6,717,052 B2 4/2004 Wang et al.
6,744,199 B1 6/2004 Tanaka
6,791,660 B1 9/2004 Hayashi et al.
6,831,725 B2 12/2004 Niiya
6,833,668 B1 12/2004 Yamada et al.
6,861,801 B2 3/2005 Kim et al.
6,878,467 B2 4/2005 Chung et al.
6,896,572 B2 5/2005 Park et al.
6,914,661 B2 7/2005 Masuda et al.
6,924,594 B2 8/2005 Ogura et al.
6,936,963 B2 8/2005 Langer et al.
6,956,324 B2 10/2005 Yamazaki
6,956,638 B2 10/2005 Akiyama et al.
6,965,195 B2 11/2005 Yamazaki et al.
6,980,275 B1 12/2005 Konuma et al.
6,993,537 B2 1/2006 Buxton et al.
6,998,776 B2 2/2006 Aitken et al.
7,030,558 B2 4/2006 Park et al.
7,098,589 B2 8/2006 Erchak et al.
7,112,115 B1 9/2006 Yamazaki et al.
7,141,925 B2 11/2006 Wittmann et al.
7,154,218 B2 12/2006 Murakami et al.
7,178,927 B2 2/2007 Seo
7,186,020 B2 3/2007 Taya et al.
7,187,121 B2 3/2007 Hasegawa et al.
7,193,218 B2 3/2007 Nagano
7,193,364 B2 3/2007 Klausmann et al.
7,193,366 B2 3/2007 Tomimatsu et al.
7,202,602 B2 4/2007 Anandan
7,211,938 B2 5/2007 Tanaka
7,214,429 B2 5/2007 Kato et al.
7,247,986 B2 7/2007 Kang et al.
7,255,823 B1 8/2007 Guether et al.
7,291,977 B2 11/2007 Kim et al.
7,306,346 B2 12/2007 Fukuoka et al.
7,317,281 B2 1/2008 Hayashi et al.
7,332,858 B2 2/2008 Nomura et al.
7,342,357 B2 3/2008 Sakano et al.
7,344,901 B2 3/2008 Hawtof et al.
7,359,021 B2 4/2008 Ota et al.
7,371,143 B2 5/2008 Becken et al.
7,393,257 B2 7/2008 Spencer et al.
7,407,423 B2 8/2008 Aitken et al.
7,423,375 B2 9/2008 Guenther et al.
7,425,166 B2 9/2008 Burt et al.
7,425,518 B2 9/2008 Yoshida et al.
7,426,010 B2 9/2008 Lee et al.
7,452,738 B2 11/2008 Hayashi et al.
7,474,375 B2 1/2009 Kwak et al.
7,498,186 B2 3/2009 Lee
7,514,280 B2 4/2009 Lee
7,528,544 B2 5/2009 Kwak et al.
7,537,504 B2 5/2009 Becken et al.
7,564,185 B2 7/2009 Song et al.
7,579,203 B2 8/2009 Yamazaki et al.
7,579,220 B2 8/2009 Ohnuma et al.
7,585,022 B2 9/2009 Achilles et al.
7,586,254 B2 9/2009 Kwak et al.
7,597,603 B2 10/2009 Becken et al.
7,821,197 B2 10/2010 Lee
7,825,594 B2 11/2010 Lee et al.
2002/0125817 A1* 9/2002 Yamazaki et al. ............ 313/498
2003/0066311 A1 4/2003 Li et al.
2003/0077396 A1 4/2003 Lecompte et al.
2003/0227252 A1 12/2003 Ikeya et al.
2004/0069017 A1 4/2004 Li et al.
2004/0075380 A1 4/2004 Takemoto et al.
2004/0104655 A1 6/2004 Kodera et al.
2004/0135520 A1 7/2004 Park et al.
2004/0169033 A1 9/2004 Kuibira et al.
2004/0169174 A1 9/2004 Huh et al.
2004/0206953 A1 10/2004 Morena et al.
2005/0127820 A1 6/2005 Yamazaki et al.
2005/0231107 A1 10/2005 Yamazaki et al.
2005/0233885 A1 10/2005 Yoshida et al.
2005/0248270 A1 11/2005 Ghosh et al.
2005/0275342 A1 12/2005 Yanagawa
2006/0082298 A1 4/2006 Becken et al.
2006/0084348 A1 4/2006 Becken et al.
2006/0284556 A1 12/2006 Tremel et al.
2006/0290261 A1 12/2006 Sawai et al.
2007/0120478 A1 5/2007 Lee et al.
2007/0170324 A1 7/2007 Lee et al.
2007/0170423 A1 7/2007 Choi et al.
2007/0170605 A1 7/2007 Lee et al.
2007/0170839 A1 7/2007 Choi et al.
2007/0170845 A1 7/2007 Choi et al.
2007/0170850 A1 7/2007 Choi et al.
2007/0170855 A1 7/2007 Choi et al.
2007/0170857 A1 7/2007 Choi et al.
2007/0170859 A1 7/2007 Choi et al.
2007/0170860 A1 7/2007 Choi et al.
2007/0170861 A1 7/2007 Lee et al.
2007/0171637 A1 7/2007 Choi
2007/0172971 A1 7/2007 Boroson
2007/0173167 A1 7/2007 Choi et al.
2007/0176549 A1 8/2007 Park
2007/0177069 A1 8/2007 Lee
2007/0197120 A1 8/2007 Lee
2007/0232182 A1 10/2007 Park
2008/0074036 A1 3/2008 Wang et al.

FOREIGN PATENT DOCUMENTS

CN 1438825 8/2003
CN 1551686 A 12/2004
CN 1577413 2/2005
CN 161636 5/2005
CN 1212662 7/2005
CN 1670570 9/2005
JP 030-37933 2/1991
JP 04-147217 5/1992
JP 04-301879 10/1992
JP 06-34983 2/1994
JP 06-337429 10/1994
JP 07-74583 3/1995
JP 09-258671 3/1997
JP 10-74583 3/1998
JP 10-125463 5/1998
JP 10-161137 6/1998
JP 63-163423 7/1998
JP 10-201585 8/1998
JP 11-007031 1/1999
JP 11-202349 7/1999
JP 2001-022293 1/2001
JP 2001-052858 2/2001
JP 2001-55527 2/2001
JP 2001-203076 2/2001
JP 2001-110564 4/2001
JP 2001-230072 8/2001
JP 2001-319775 11/2001
JP 2002 020169 1/2002
JP 2002-93576 3/2002
JP 2002-100472 4/2002
JP 2002 117777 4/2002
JP 2002 170664 6/2002
JP 2002-216951 8/2002
JP 2002-280169 9/2002

| | | |
|---|---|---|
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005-222807 | 8/2005 |
| JP | 2005-251415 | 9/2005 |
| JP | 2005 251415 | 9/2005 |
| JP | 2005 258405 | 9/2005 |
| JP | 2005-302707 | 10/2005 |
| JP | 2005 340020 | 12/2005 |
| JP | 2006 524419 | 10/2006 |
| KR | 10-1995-0009817 A | 4/1995 |
| KR | 10-1998-0017583 | 6/1998 |
| KR | 10-2000-0045292 | 7/2000 |
| KR | 10-2001-0079597 | 8/2001 |
| KR | 10-2001-0084380 | 9/2001 |
| KR | 10-2002-0051153 | 6/2002 |
| KR | 10-2003-0044656 | 6/2003 |
| KR | 10-2004-0011138 | 2/2004 |
| KR | 10-2005-0024592 | 3/2005 |
| KR | 10-2005-070543 | 7/2005 |
| KR | 10-2005-0076664 | 7/2005 |
| KR | 10-2005-0112318 | 11/2005 |
| KR | 10-2005-0115408 | 12/2005 |
| KR | 10-2006-0005369 | 1/2006 |
| KR | 10-2006-0006148 | 1/2006 |
| KR | 10-2006-0006149 | 1/2006 |
| KR | 10-2006-0007025 | 1/2006 |
| KR | 10-2006-0007353 | 1/2006 |
| KR | 10-2006-0007354 | 1/2006 |
| KR | 10-2006-0007889 | 1/2006 |
| KR | 10-2006-0007890 | 1/2006 |
| KR | 10-2006-0007892 | 1/2006 |
| KR | 10-2006-0007893 | 1/2006 |
| KR | 10-2006-0007962 | 1/2006 |
| KR | 10-2006-0007963 | 1/2006 |
| KR | 10-2006-0008462 | 1/2006 |
| KR | 10-2006-0008463 | 1/2006 |
| KR | 10-2006-0008464 | 1/2006 |
| KR | 10-2006-0008761 | 1/2006 |
| KR | 10-2006-0008769 | 1/2006 |
| KR | 10-2006-0011831 | 2/2006 |
| KR | 10-2006-0016188 | 2/2006 |
| KR | 10-2006-0016316 | 2/2006 |
| KR | 10-2006-0016446 | 2/2006 |
| KR | 10-2006-0016856 | 2/2006 |
| KR | 10-2006-0016857 | 2/2006 |
| KR | 10-2006-0020109 | 3/2006 |
| KR | 10-2006-0025755 | 3/2006 |
| KR | 10-2006-0026816 | 3/2006 |
| KR | 10-2006-0027321 | 3/2006 |
| KR | 10-2006-0028571 | 3/2006 |
| KR | 10-2006-0035455 | 4/2006 |
| TW | 508976 | 11/2002 |
| TW | 564563 | 12/2003 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| TW | 1I277125 | 3/2007 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/112160 | 12/2004 |
| WO | WO 2005/050751 | 6/2005 |

OTHER PUBLICATIONS

Japan Office Action dated Jul. 28, 2009 of the Japanese Patent Application No. 2006 178508.

Japan Office Action dated Jul. 14, 2009 of the Japanese Patent Application No. 2006-151960.

Japan Office Action dated Jul. 14, 2009 of the Japanese Patent Application No. 2006-165210.

Japanese Office Action issued Sep. 8, 2009 in Japanese Patent Application 2007-011996.

U.S. Appl. No. 11/540,150, filed Sep. 29, 2006, and its ongoing prosecution history, including without limitation Office Actions, Amendments, Remarks, and any other potentially releveant documents, Song et al.

Taiwanese Office Action issued Jan. 18, 2010 from Application No. 95145107.

Taiwanese Office Action Issued Apr. 2, 2010 from Application No. 95144932.

U.S. Office Action dated Mar. 29, 2010 in U.S. Appl. No. 11/541,055.

U.S. Office Action (Advisory Action) dated May 19, 2010 in U.S. Appl. No. 11/529,914.

U.S. Office Action dated May 25,2010 in U.S. Appl. No. 11/529,995.

Chinese Office Action and English translation in corresponding Patent Application No. 200710000143.2 dated Sep. 26, 2008.

Chinese Office Action issued Oct. 10, 2008 in corresponding Patent Application No. 2007100040808.

Chinese Office Action issued Aug. 1, 2008 Patent Application No. 200710001301.6 with English translation.

Chinese Office Action issued Oct. 10, 2008 in Corresponding Patent Application No. 200710003941.0 with its English translation—11 pages.

Chinese Office Action issued Oct. 10, 2008 in Patent Application No. 200710001782.0.

Chinese Office Action issued on Aug. 1, 2008 in corresponding Patent Application No. 2007100015717 (w/English translation) in 19 pages.

Chinese Office Action Issued on Dec. 19, 2008 in Corresponding Patent Application No. 2007100072531 with its English translation—13 pages.

Chinese Rejection Decision issued on May 8, 2009 in the corresponding Patent Application No. 200710004080.8.

Chinese Office Action issued on Jan. 8, 2010 in corresponding Patent Application No. 200710003941.0.

European Search Report from the corresponding European Patent Application No. 07101294.2 dated Jun. 6, 2007.

European Search Report from the corresponding European Patent Application No. 07101295.9 dated May 24, 2007.

Japanese Office Action dated Dec. 1, 2009 for Japanese Patent Application No. 2006-193033, which claims priority of the corresponding Korean priority Application No. 10-2006-0007893.

Japanese Office Action mailed Jun. 30, 2009 for Japanese Application No. 2006-222065.

Japanese Office Action dated Jul. 28, 2009 of the Japanese Patent Application No. 2006-153567, which claims priority of the corresponding Korean priority application No. 10-2006-0008462.

Japanese Office Action for Patent Application No. 2006-193032 mailed May 19, 2009.

Japanese Office Action issued on May 19, 2009 in the corresponding Japanese Patent Application No. 2006-189628.

Japanese Office Action issued on Oct. 20, 2009 in the corresponding Japanese Patent Application No. 2006-189628.

Japanese Office Action issued on Oct. 27, 2009 in the corresponding Japanese Patent Application No. 2006-256002.

Japanese Office Action re Patent Application No. 2006-193034 mailed May 19, 2009.

Korean Notice of Allowance issued Aug. 2, 2007 in counterpart Korean Patent Application No. 10-2006-0016188.

Korean Notice of Allowance issued Jul. 3, 2007 in counterpart Korean Patent Application No. 10-2006-0035455.
Korean Office Action from corresponding Patent Application No. 10-2006-0006148 dated Sep. 26, 2006.
Korean Office Action from corresponding Patent Application No. 10-2006-0007890, dated Sep. 26, 2006.
Korean Office Action from corresponding Patent Application No. 10-2006-0007963, dated Sep. 26, 2006.
Korean Office Action issued Feb. 12, 2007 in counterpart Korean Patent Application No. 10-2006-0035455.
Taiwanese Office Action issued Jan. 18, 2010 from corresponding TW Application No. 95145107 (which claims priority to KR App. No. 10-2006-0008463).
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Aug. 19, 2009 in U.S. Appl. No. 11/529,914.
U.S. Office Action dated Dec. 31, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Appl. No. 11/540,024, filed Sep. 29, 2006, Published as 2007/0170605 on Jul. 26, 2007, and its ongoing prosecution history, including without limitation Office Actions, Amendments, Remarks, and any other potentially revelant documents.
U.S. Appl. No. 11/540,149, filed Sep. 29, 2006, Published as 2007/0170324 on Jul. 26, 2007, and its ongoing prosecution history, including without limitation Office Actions, Amendments, Remarks, and any other potentially revelant documents.
U.S. Appl. No. 11/540,021, filed Sep. 29, 2006, Published as 2007/0170423 on Jul. 26, 2007, and its ongoing prosecution history, including without limitation Office Actions, Amendments, Remarks, and any other potentially revelant documents.
U.S. Appl. No. 11/541,047, filed Sep. 29, 2006, Published as 2007/0170839 on Jul. 26, 2007, and its ongoing prosecution history, including without limitation Office Actions, Amendments, Remarks, and any other potentially revelant documents.
U.S. Appl. No. 11/541,139, filed Sep. 29, 2006, Published as 2007/0170845 on Jul. 26, 2007, and its ongoing prosecution history, including without limitation Office Actions, Amendments, Remarks, and any other potentially revelant documents.
U.S. Appl. No. 11/529,916, filed Sep. 29, 2006, Published as 2007/0170850 on Jul. 26, 2007, and its ongoing prosecution history, including without limitation Office Actions, Amendments, Remarks, and any other potentially revelant documents.
U.S. Appl. No. 11/529,891, filed Sep. 29, 2006, Published as 2007/0170855 on Jul. 26, 2007, and its ongoing prosecution history, including without limitation Office Actions, Amendments, Remarks, and any other potentially revelant documents.
U.S. Appl. No. 11/529,914, filed Sep. 29, 2006, Published as 2007/0170857 on Jul. 26, 2007, and its ongoing prosecution history, including without limitation Office Actions, Amendments, Remarks, and any other potentially revelant documents.
U.S. Appl. No. 11/540,103, filed Sep. 29, 2006, Published as 2007/0170859 on Jul. 26, 2007, and its ongoing prosecution history, including without limitation Office Actions, Amendments, Remarks, and any other potentially revelant documents.
U.S. Appl. No. 11/540,151, filed Sep. 29, 2006, Published as 2007/0170860 on Jul. 26, 2007, and its ongoing prosecution history, including without limitation Office Actions, Amendments, Remarks, and any other potentially revelant documents.
U.S. Appl. No. 11/540,157, filed Sep. 29, 2006, Published as 2007/0170861 on Jul. 26, 2007, and its ongoing prosecution history, including without limitation Office Actions, Amendments, Remarks, and any other potentially revelant documents.
U.S. Appl. No. 11/529,995, filed Sep. 29, 2006, Published as 2007/0171637 on Jul. 26, 2007, and its ongoing prosecution history, including without limitation Office Actions, Amendments, Remarks, and any other potentially revelant documents.
U.S. Appl. No. 11/541,055, filed Sep. 29, 2006, Published as 2007/0173167 on Jul. 26, 2007, and its ongoing prosecution history, including without limitation Office Actions, Amendments, Remarks, and any other potentially revelant documents.
U.S. Appl. No. 11/541,009, filed Sep. 29, 2006, Published as 2007/0176549 on Aug. 2, 2007, and its ongoing prosecution history, including without limitation Office Actions, Amendments, Remarks, and any other potentially revelant documents.
U.S. Appl. No. 11/541,048, filed Sep. 29, 2006, Published as 2007/0177069 on Aug. 2, 2007, and its ongoing prosecution history, including without limitation Office Actions, Amendments, Remarks, and any other potentially revelant documents.
Japanese Office Action dated Jun. 15, 2010 of the Japanese Patent Application No. 2006-151960.
U.S. Office Action dated Aug. 19, 2010 in U.S. Appl. No. 11/529,914.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 30, 2009 in U.S. Appl. No. 11/541,048.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 8, 2009 in U.S. Appl. No. 11/540,149.
U.S. Appl. No. 11/529,883, filed Sep. 29, 2006, Published as 2007/0197120 on Aug. 23, 2007, and its ongoing prosecution history, including without limitation Office Actions, Amendments, Remarks, and any other potentially revelant documents.
U.S. Appl. No. 11/540,008, filed Sep. 29, 2006, Published as 2007/0232182 on Oct. 4, 2007, and its ongoing prosecution history, including without limitation Office Actions, Amendments, Remarks, and any other potentially revelant documents.
U.S. Appl. No. 11/670,356, filed Feb. 1, 2007, Published as 2008/0074036 on Mar. 27, 2008, and its ongoing prosecution history, including without limitation Office Actions, Amendments, Remarks, and any other potentially revelant documents.

* cited by examiner

ORGANIC LIGHT-EMITTING DISPLAY DEVICE WITH FRIT SEAL AND REINFORCING STRUCTURE BONDED TO FRAME

CROSS-REFERENCE TO RELATED APPLICATIONS

This application claims the benefit of Korean Patent Application No. 2006-7893, filed on Jan. 25, 2006, in the Korean Intellectual Property Office, the disclosure of which is incorporated herein by reference in its entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE WITH FRIT SEAL AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY AND METHOD OF FABRICATING THE SAME | Sep. 29, 2006 | 11/540,150 |
| ORGANIC LIGHT EMITTING DISPLAY WITH DOUBLE-LAYERED FRIT SEALING | Sep. 29, 2006 | 11/541,009 |
| METHOD FOR PACKAGING ORGANIC LIGHT EMITTING DISPLAY WITH FRIT SEAL AND REINFORCING STURUTURE | Sep. 29, 2006 | 11/529,910 |
| METHOD FOR PACKAGING ORGANIC LIGHT EMITTING DISPLAY WITH FRIT SEAL AND REINFORCING STURUTURE | Sep. 29, 2006 | 11/540,084 |
| METHOD OF SEALING AN ORGANIC LIGHT-EMITTING DISPLAY BY MEANS OF GLASS FRIT SEAL ASSEMBLY | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND METHOD OF FABRICATING THE SAME | Sep. 29, 2006 | 11/540,149 |
| ORGANIC LIGHT EMITTING DISPLAY DEVICE METHOD OF FABRICATING THE SAME | Sep. 29, 2006 | 11/529,916 |
| ORGANIC LIGHT EMITTING DISPLAY DEVICE INCLUDING A GAP TO IMPROVE IMAGE QUALITY AND METHOD OF FABRICATING THE SAME | Sep. 29, 2006 | 11/529,891 |
| ORGANIC LIGHT EMITTING DISPLAY AND METHOD OF FABRICATING THE SAME | Sep. 29, 2006 | 11/540,103 |

BACKGROUND

1. Field of the Invention

The present invention relates to organic light-emitting display devices and, more particularly, to packaging such devices.

2. Discussion of Related Art

An organic light-emitting display device is one of the flat panel displays in which an electron injected to one electrode and a hole injected to the other electrode binds to each other in an organic light-emitting layer when the organic light-emitting layer is arranged between facing electrodes and a voltage is applied to both electrodes, wherein when luminescent molecules of the light-emitting layer are excited by binding of the electron and the hole, energy is emitted by returning to a ground state, and then converted into the light. The organic light-emitting display devices exhibiting such a light-emission principle has drawn attention as a next-generation display since they are excellent in visibility, and they may be also manufactured in a light weight and thin shape and driven at a low voltage. U.S. Pat. No. 6,998,776 B2 discloses that an organic light-emitting display includes a first substrate plate, a second substrate plate and a frit connecting the plates.

SUMMARY OF CERTAIN INVENTIVE ASPECTS

An aspect of the invention provides an organic light-emitting display device, which may comprises: an organic light-emitting display unit comprising: a front substrate comprising a front surface and a first side surface, a rear substrate comprising a rear surface and a first side surface, the rear substrate opposing the front substrate, an array of organic light-emitting pixels interposed between the front and rear substrates, a frit seal interposed between the front substrate and the rear substrate while surrounding the array, wherein the frit seal, the front substrate and the rear substrate together define an enclosed space in which the array is located, the frit seal comprising a first side surface, and a first side comprising the first side surfaces of the front substrate, the rear substrate and the frit seal; a bracket comprising a first surface generally opposing the first side of the unit and connected to the first side of the unit; and a first structure interconnecting the first surface of the bracket and the first side of the unit.

In the foregoing device, the first structure may be formed in substantially the entire area between the first surface of the bracket and the first side of the unit. The first structure may be formed on substantially throughout the first surface of the bracket. The first structure may be bonded to the first surface of the bracket and bonded to either or both of the first side surfaces of the front and rear substrates. The first structure may be bonded to the first side surface of the frit seal. The front substrate, the rear substrate and the first side surface of the frit seal may define a gap space, and wherein the first structure may comprise a portion extending into the gap space and interposed between the front and rear substrates. The bracket may further comprise a rear wall opposing the rear substrate. The rear wall of the bracket may be bonded to the rear surface of the rear substrate. The bracket may comprise a rear wall opposing the rear substrate, and the bracket may further comprise a plurality of side walls extending from the rear wall at an angle, and wherein a first one of the plurality of the side walls may provide the first surface opposing the first side of the unit. The first side wall may extend substantially parallel to at least one of the first side surfaces of the front and rear substrates. The first side wall may cover substantially the entirety of the first side of the unit. The first side wall may not cover at least part of the first side surface of the front substrate while generally opposing the first side of the unit. The first side wall may not cover the first side surface of the front substrate while generally opposing the first side of the unit. The structure may comprise a layer comprising a polymeric material.

Still in the foregoing device, the unit may further comprise a plurality additional sides, wherein the bracket comprises a first side wall and a plurality of additional side walls, the first side wall providing the first surface of the frame, wherein each of the plurality of additional side walls of the bracket may comprise a surface generally opposing one of the plurality of additional sides of the unit, wherein the device may further comprise a plurality of additional structures, each of which interconnects one of the plurality of additional side walls and one of the plurality of additional sides of the unit. The first side wall and the plurality of additional side walls may form a closed loop surrounding the first side and the plurality of additional sides of the unit. The front substrate may further comprise a second side surface, wherein the rear substrate may further comprise a second side surface, wherein the frit seal may further comprise a second side surface, wherein the second side surfaces of the front substrate, the second substrate and the frit seal generally face the same direction, wherein the unit may further comprise a second side comprising a second side surface of the front substrate, a second side surface of the rear substrate and a second side surface of the frit seal, wherein the bracket may further comprise a second surface generally opposing the second side of the device, and wherein the unit may further comprise a second structure interconnecting the second side of the unit and the second surface of the frame. The first and second structures may be integrated. The first and second structures may be separated. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light-emitting display device, which may comprises: providing a device comprising: a front substrate comprising a front surface and a first side surface, a rear substrate comprising a rear surface and a first side surface, the rear substrate opposing the front substrate, an array of organic light-emitting pixels interposed between the front and rear substrates, a frit seal interposed between the front substrate and the rear substrate while surrounding the array, wherein the frit seal, the front substrate and the rear substrate together define an enclosed space in which the array is located, the frit seal comprising a first side surface, and a first side comprising the first sides of the front substrate, the rear substrate and the frit seal; placing a bracket comprising a first surface so as to generally the first side of the device; and forming a structure between and interconnecting the first surface of the bracket and the first side of the device.

In the foregoing method, the method may further comprise forming a curable material on the first surface of the frame, and wherein placing the bracket may comprise arranging the bracket with respect to the device such that the curable material contacts the first side of the device. The method may further comprise curing the curable material, thereby forming the structure. A viscosity of the curable material may be less than about 5000 cP. The bracket may further comprise a rear wall, and wherein placing the bracket may further comprise arranging the rear wall so as to oppose the rear substrate.

Still another aspect of the present invention provides an organic light-emitting display device including a first substrate comprising a pixel region in which an organic light-emitting diode is formed in a surface thereof, and a non-pixel region formed in a circumference of the pixel region, the organic light-emitting diode comprising an organic light-emitting layer between a first electrode and a second electrode; a second substrate attached to one surface comprising the pixel region of the first substrate; a frit provided between the non-pixel region of the first substrate and the second substrate and attaching the first substrate and the second substrate to each other; a bracket with which the first substrate and the second substrate, both attached to each other, are mounted; and a reinforcement material applied to an inner wall of the bracket, infiltrated between the attached first and second substrates, and then cured.

Further aspect of the present invention provides a method for preparing an organic light-emitting display device including a first substrate including an organic light-emitting diode, and an encapsulation substrate for encapsulating at least a pixel region of the substrate, the method including the first step of applying a frit to form a line spaced apart from an edge of the encapsulation substrate; the second step of attaching a deposition substrate, on which an organic light-emitting diode is deposited, to the second substrate; the third step of melting the frit to attach the first substrate and the second substrate to each other by irradiating a laser or an infrared ray to the frit between the first substrate and the second substrate, both attached to each other; the fourth step of applying a reinforcement material for filling a gap between the first substrate and the second substrate in an inner wall of the bracket with which the attached first and second substrates are mounted; and the fifth step of mounting the first and second substrates so that the sealing material applied in the inner wall of the bracket can be in contact with the gap between the first substrate and the second substrate, both attached to each other. The organic light-emitting diode may be completely protected from the open air by completely coalescing a substrate and a encapsulation substrate to each other using a frit and solving brittleness of the organic light-emitting display device when the frit is used herein.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF EMBODIMENTS

Hereinafter, embodiments according to the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

OLEDs can be generally grouped into two basic types dependent on the arrangement with which the stimulating electrical current is provided. FIG. 6A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Figure 5A:
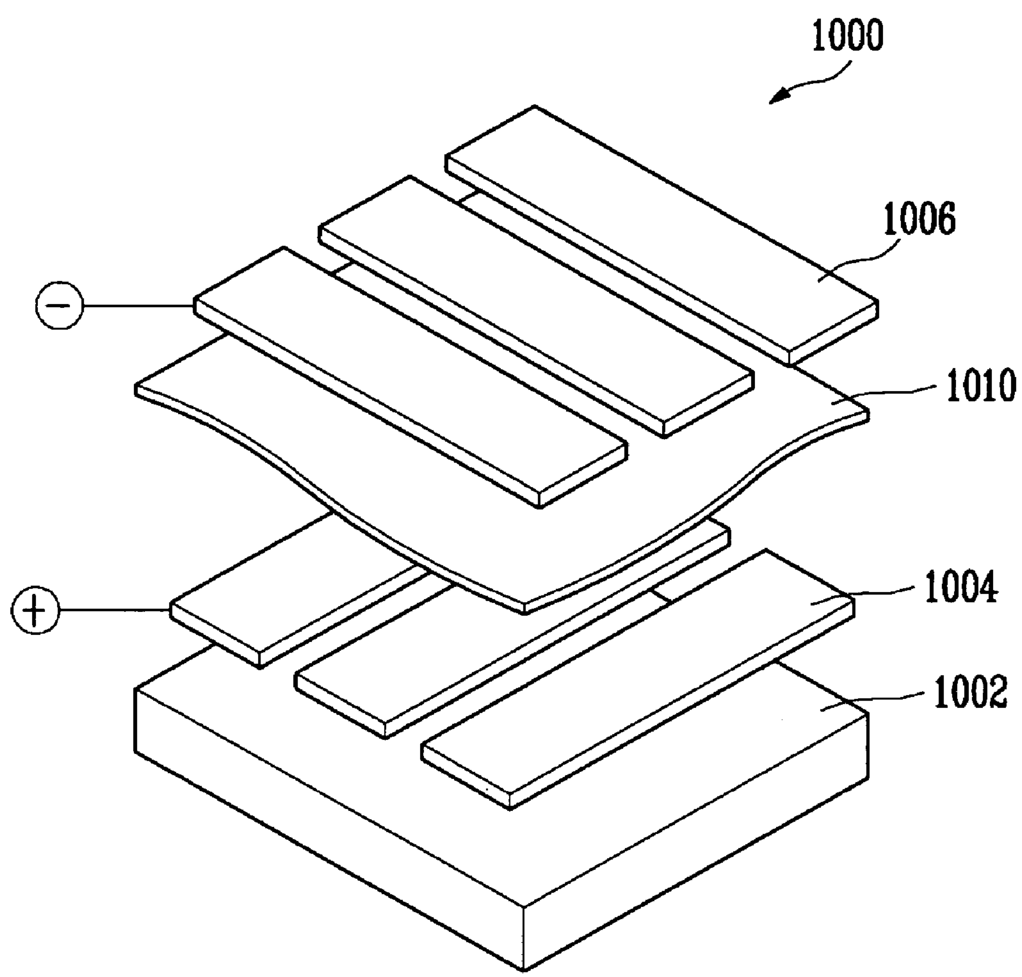
FIG. 5A is a schematic exploded view of a passive matrix type organic light emitting display device in accordance with one embodiment.
Figure 5B:
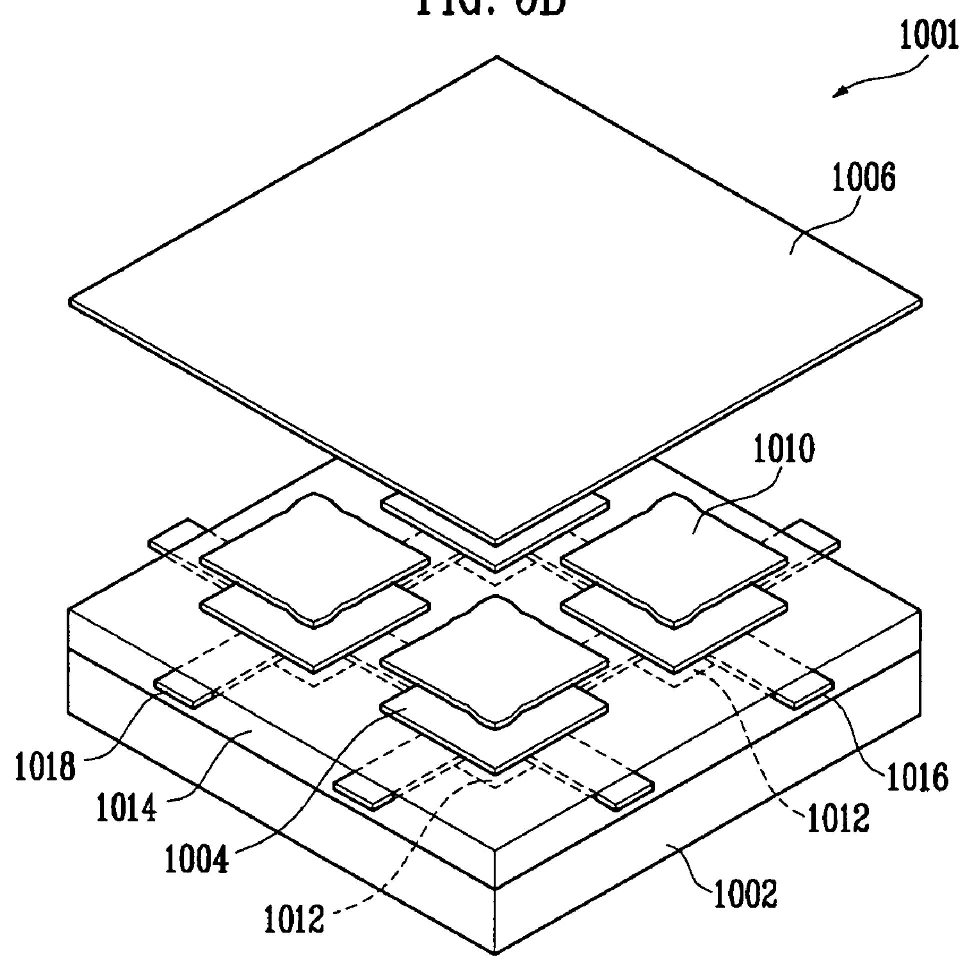
FIG. 5B is a schematic exploded view of an active matrix type organic light emitting display device in accordance with one embodiment.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes localdriving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
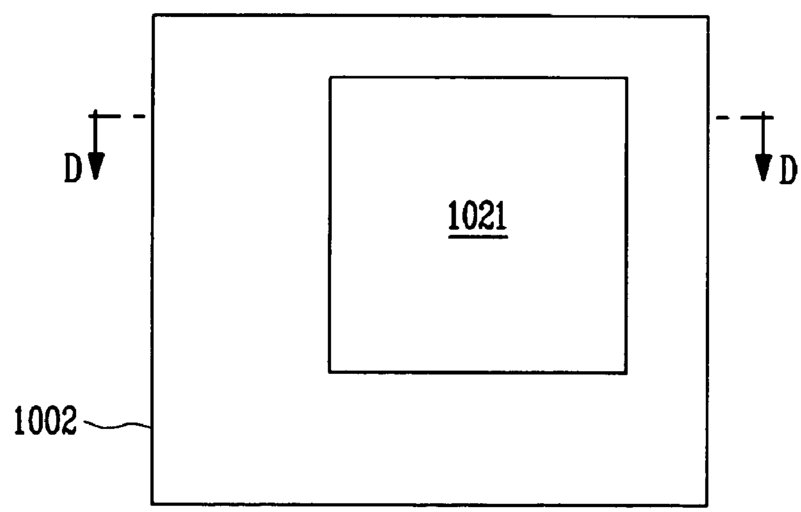
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
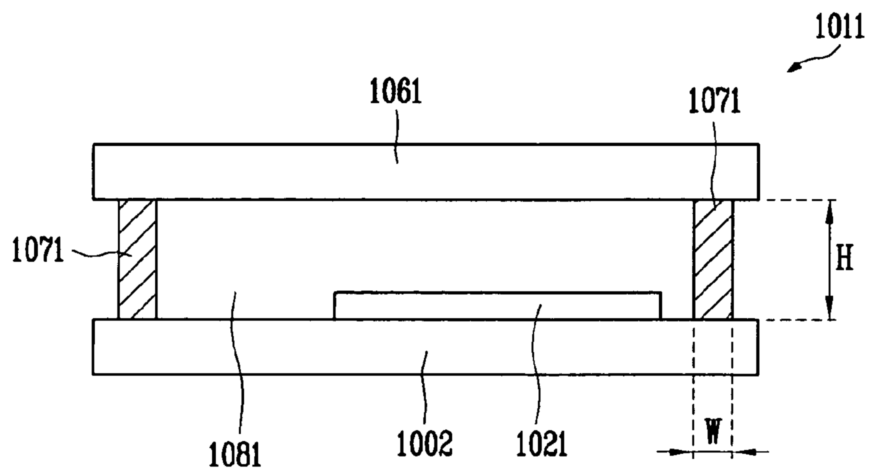
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
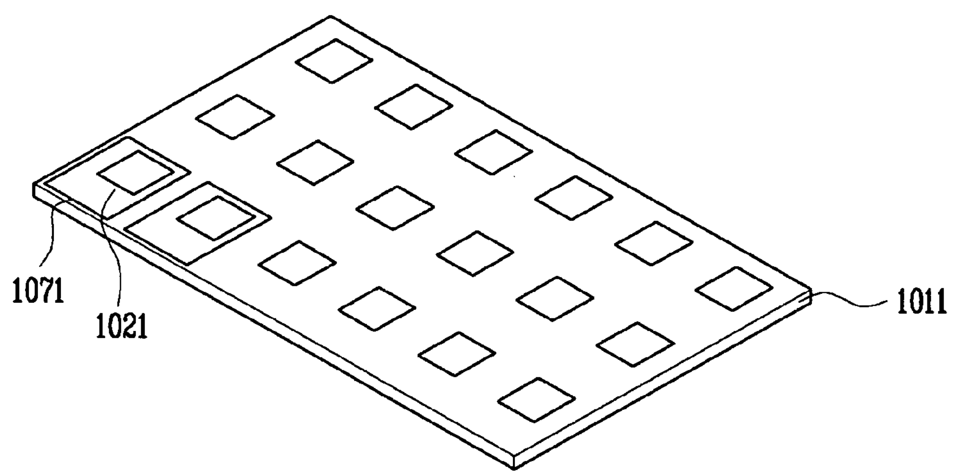
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

Figure 1:
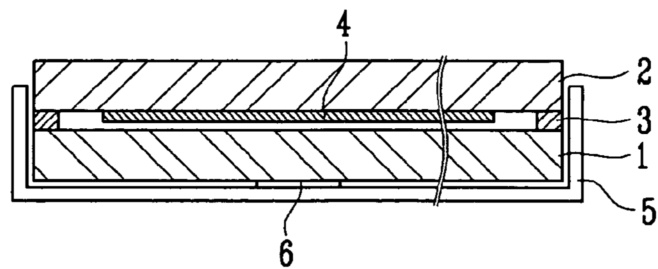
FIG. 1 is a cross-sectional view showing an organic light-emitting display device.

One problem of the organic light-emitting display device is that the device can be deteriorated when moisture contacts organic materials constituting the organic light-emitting elements. FIG. 1 is a cross-sectional view showing an encapsulation structure of an organic light-emitting device that can prevent moisture from contacting organic materials. In the illustrated structure, the organic light-emitting display device is including a substrate 1, an encapsulation substrate 2, a sealing material 3, a moisture-absorbing material 4 and a bracket 5. The substrate 1 includes a pixel region including at least one organic light-emitting device, and a non-pixel region formed outside the pixel region, and the encapsulation substrate 2 is attached against a surface in which organic light-emitting elements of the substrate 1 are formed.

In order to attach the substrate 1 to the encapsulation substrate 2, the sealing material 3 is applied along edges of the deposition substrate 1 and the encapsulation substrate 2, and the sealing material 3 is then cured using UV irradiation, etc. A moisture-absorbing material 4 is included in the encapsulation substrate 2 for capturing moisture and certain gases such as hydrogen, oxygen. The bracket 5 is a kind of a frame for supporting an organic light-emitting panel to which the substrate 1 and the encapsulation substrate 2 are attached. In one embodiment, the bracket 5 and the organic light-emitting device may be attached with a double side adhesive tape 6. Even in the illustrated device, however, the sealing material 3 may not completely prevent moisture or air entering into the enclosed space. Also, there may be cracks in the sealing material 3 and in the interfacial area where the sealing material 3 contacts the substrate for various reasons.

Figure 2:
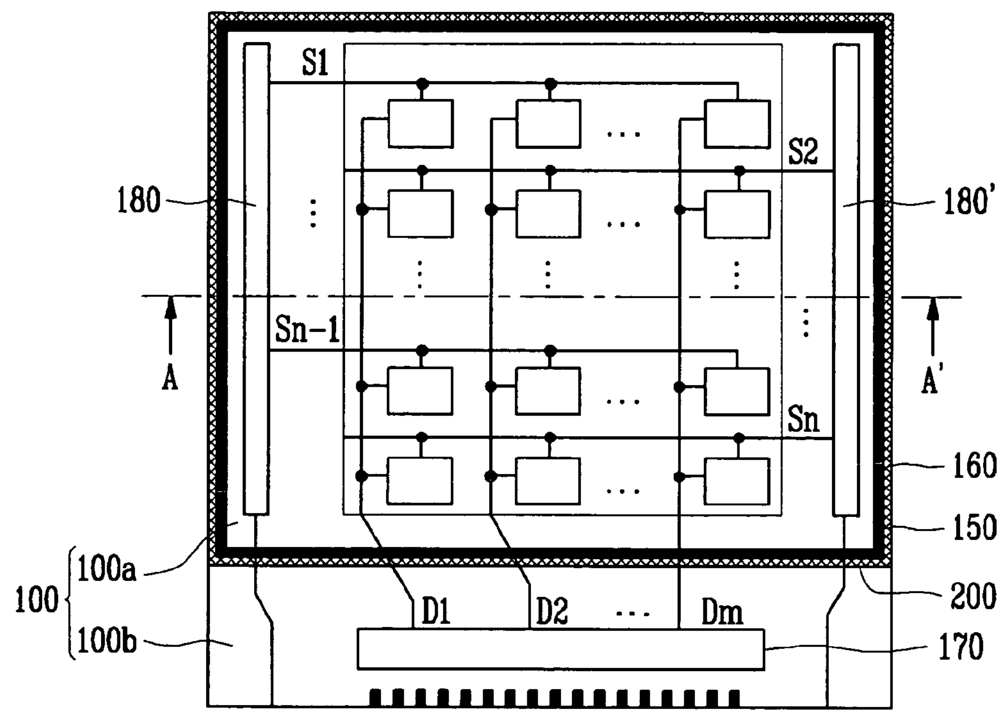
FIG. 2 is a plan view showing an organic light-emitting display device according to one embodiment of the present invention.
Figure 3:
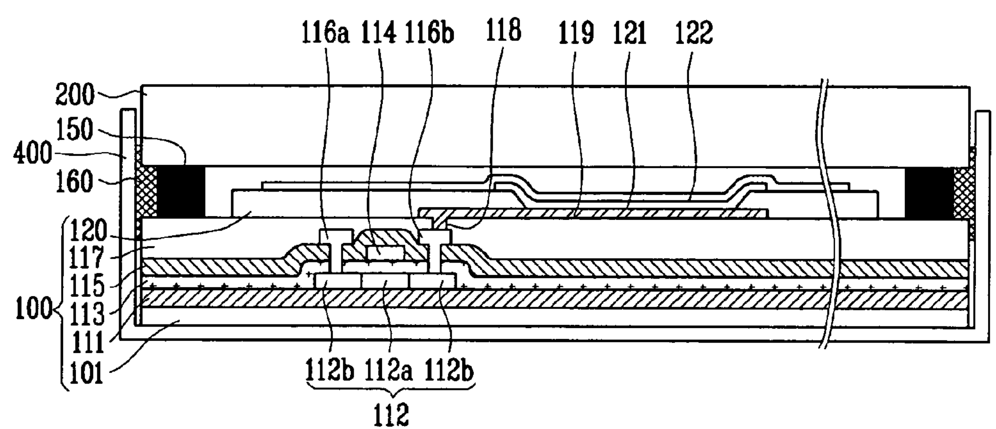
FIG. 3 is a cross-sectional view taken along a line A-A' of FIG. 2.

FIG. 2 is a plan view showing an organic light-emitting display device according to one embodiment of the present invention; and FIG. 3 is a plane view taken along a line A-A' of FIG. 2. Referring to figures, the organic light-emitting display device includes a substrate 100, an encapsulation substrate 200, a frit 150 and a reinforcement material or structure 160. For the sake of convenience, the deposition substrate 101 refers to a base, on which circuits and layers are formed, and the substrate 100 refers to an unfinished product including the deposition substrate 101 and circuits and layers formed thereon, including an array of organic light emitting pixels.

The substrate 100, which is equivalent to the bottom plate 1002, is a plate including organic light-emitting diodes or pixels, and includes a pixel region 100*a* in which at least one organic light-emitting diode or pixel is formed, and a non-pixel region 100*b* formed outside of the pixel region 100*a*, the organic light-emitting diode including a first electrode 119, an organic layer 121 and a second electrode 122. Hereinafter, the pixel region 100*a* is referred to as a region for displaying a predetermined image using the light emitted from an organic light-emitting diode, and the non-pixel region 100*b* is referred to as the entire region except the pixel region 100*a* on the substrate 100 in the description of this application.

The pixel region 100*a* includes a plurality of scan lines (S1 to Sm) arranged in a horizontal direction, and a plurality of data lines (D1 to Dm) arranged in a vertical direction, and a plurality of pixels are formed in the scan lines (S1 to Sm) and the data lines (D1 to Dm), the pixels receiving signals from driver integrated circuits 300,400 for driving an organic light-emitting diode. Also, a driver integrated circuit (Driver IC) for driving an organic light-emitting diodes or pixels, and metal wirings electrically attached to each of the scan lines (S1 to Sm) and the data lines (D1 to Dm) of the pixel region are formed in the non-pixel region 100*b*. In an embodiment, the driver integrated circuit includes a data driving unit 170 and a scan driving unit 180.

The organic light-emitting diode is driven in an active matrix method, as shown in the drawings, and its configuration will be described in brief. A buffer layer 111 is formed on a deposition substrate 101, and the buffer layer 111 is formed of insulating materials such as silicon oxide ($SiO_2$) or silicon nitride (SiNx). The buffer layer 111 prevents the substrate 100 from being damaged by factors such as heat from the outside, etc. On at least one region of the buffer layer 111 is formed a semiconductor layer 112 including an active layer 112*a* and an ohmic contact layer 112*b*. On the semiconductor layer 112 and the buffer layer 111 is formed a gate insulating layer 113, and on one region of the gate insulating layer 113 is formed a gate electrode 114 having a size corresponding to a width of the active layer 112*a*.

An interlayer insulating layer 115 includes the gate electrode 114 and is formed on the gate insulating layer 113, and source and drain electrodes 116*a*, 116*b* are formed on a predetermined region of the interlayer insulating layer 115. The source and drain electrodes 116*a*, 116*b* are formed so that they can be connected to one exposed region of the ohmic contact layer 112*b*, and an overcoat 117 includes the source and drain electrodes 116*a*,116*b* and is formed on the interlayer insulating layer 115. A first electrode 119 is formed on one region of the overcoat 117, wherein the first electrode 119 is connected with one exposed region of either one of the source and drain electrodes 116*a*,116*b* by means of a via hole 118.

A pixel definition layer 120 includes the first electrode 119 and is formed on the overcoat 117, the pixel definition layer 120 having an opening (not shown) to which at least one region of the first electrode 119 is exposed. An organic layer 121 is formed on the opening of the pixel definition layer 120, and a second electrode layer 122 includes the organic layer 121 and is formed on the pixel definition layer 120. In an embodiment, a passivation layer may be further formed in an upper portion of the second electrode layer 122. However, various modifications and changes may be made in an active matrix structure or a passive matrix structure of the organic light-emitting diode.

The encapsulation substrate 200, which is equivalent to the top plate 1061, is a member for encapsulating at least one pixel region 100*a* of the substrate in which the organic light-emitting diode is formed, and is formed of transparent materials in the case of top emission or dual emission and formed of translucent materials in the case of bottom emission. Various materials of the encapsulation substrate 200 can be used in the embodiments of the present invention, but a glass may be preferably used in this embodiment, for example in the case of the top emission, although not limited thereto.

In an embodiment, the encapsulation substrate 200 is formed in a plate shape in this embodiment, and encapsulates a pixel region in which the organic light-emitting diode is formed on at least the substrate 100. For example, the entire region is encapsulated except a data driving unit and a pad unit in this embodiment. The frit 150 is formed between the encapsulation substrate 200 and the non-pixel region 100*b* of the substrate 100 to seal the pixel region 100*a* so that the air or moisture is prevented from being infiltrated.

In an embodiment, the frit 150 preferably forms a line spaced apart at a constant distance from an edge of an interface in which the encapsulation substrate 200 and the substrate 100 are coalesced to each other. This is to secure a space that forms a reinforcement material 160, as described later. The frit 150 includes a glass material, a absorbing material for absorbing a laser, a filler for reducing a thermal expansion coefficient, etc., and is applied to the encapsulation substrate 200 in a state of frit paste, melted and cured to form the frit seal between the encapsulation substrate 200 and the substrate 100 using a laser or an infrared ray to seal between the encapsulation substrate 200 and the substrate 100. In an embodiment, the line in which the frit 150 is formed preferably has a width of about 0.5 to about 1.5 mm. Also, a height of each frit 150 preferably ranges from about 10 to about 20 μm.

Meanwhile, various configurations and materials of a surface of the substrate 100 which the frit 150 contacts can be used although not limited thereto. In an embodiment, the frit is not overlapped with a metal wiring as possible as it is, except an area where a metal wiring directly connected with a driver integrated circuit. As described above, if the frit 150 is overlapped with the metal wiring, the metal wiring may be damaged due to irradiation of a laser or an infrared ray.

The bracket 400 is a kind of a frame for supporting an organic light-emitting panel to which a substrate 100 and an encapsulation substrate 200 are attached. In an embodiment illustrated in FIG. 3, the bracket 400 has a rear wall 450 and a plurality of side walls 460 extending from the rear wall 450. In an embodiment, the bracket does not have a rear wall 450 shown in FIG. 3 and may have a closed loop shape formed by the plurality of side walls 460 shown in FIG. 3. In the embodiment illustrated in FIG. 3, the rear wall 450 of the bracket 400 and a surface of the organic light-emitting panel may be attached with an adhesive tape, etc.

In an embodiment, the reinforcement material 160 is a member that is formed in a gap between a surface of the organic light-emitting panel and an inner surface of the bracket and then cured, and therefore the reinforcement material 160 prevents an organic light-emitting display device from being easily damaged or broken and also functions as a sealing material when the frit 150 is not attached or its adhesive force is reduced. In an embodiment, curable materials which are naturally cured, thermally cured or UV-cured, may be used. Liquid materials can be used for forming the reinforcement material 160. For example, cyanoacrylate may be used as the naturally cured material; acrylate may be used as the material that is thermally cured at a temperature of about 80° C. or less; and epoxy, acrylate and urethane acrylate may be used as the UV-cured materials.

Hereinafter, embodiments of a method for preparing an organic light-emitting display device according to the present invention will be described in detail. FIGS. 4*a* to 4*e* are process views showing a process for preparing an organic light-emitting display device. Firstly, a frit 150 is applied in a linear shape in a point spaced apart at a predetermined distance from an edge of an encapsulation substrate 200, and the frit 150 is formed in a point corresponding to a non-pixel region 100*a* of the substrate 100, as described later. In an embodiment, a height of the frit 150 preferably ranges from about 10 to about 20 μm. The frit 150 is applied to the encapsulation substrate 200 at a state of the frit paste, sintered to remove moisture or organic binders that are included in the paste, and then cured.

Figure 4A:
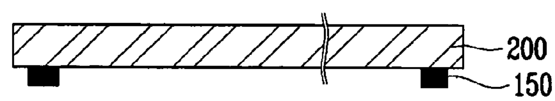
FIGS. 4*a* to 4*d* are cross-sectional views showing a process for preparing an organic light-emitting display device according to an embodiment of the present invention.
Figure 4B:
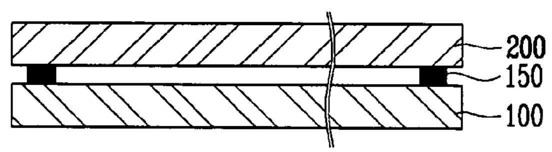
Figure 4C:
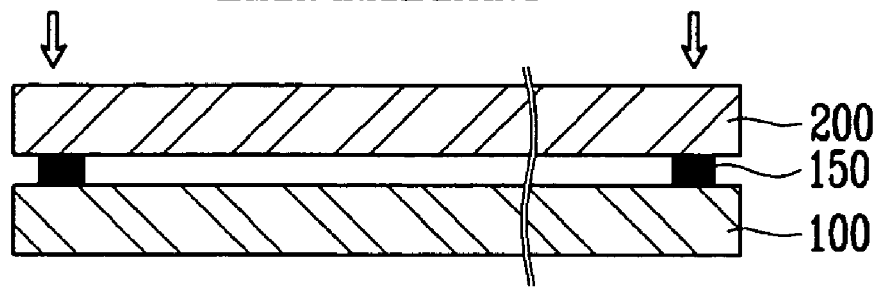

Next, a substrate 100 including a pixel region including an organic light-emitting diode, and a non-pixel region in which a driver integrated circuit and a metal wiring, etc. are formed is provided, and an encapsulation substrate 200 is coalesced. In an embodiment, encapsulation substrate 200 may or may not encapsulate a driver integrated circuit of the substrate 100, depending on its design. (FIG. 4*b*) Next, a laser or an infrared ray is irradiated to the frit 150 between the substrate 100 and the encapsulation substrate 200, both coalesced to each other, to melt the frit 150 between the substrate 100 and the encapsulation substrate 200. In an embodiment, the irradiated laser or infrared ray preferably has, for example, a wavelength of about 800 to about 1200 nm (and preferably about 810 nm), its power preferably ranges from about 25 to about 45 watt, and a region except the frit is preferably masked. A bilayer of cooper and aluminum may be used as materials of the mask. Then, the substrate 100 and the encapsulation substrate 200 are attached to each other by curing the melted frit 150. (FIG. 4*c*)

Figure 4D:
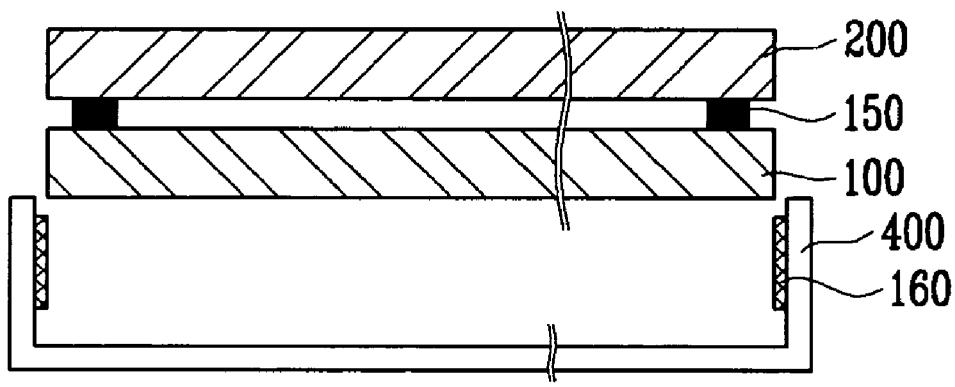
Figure 4E:
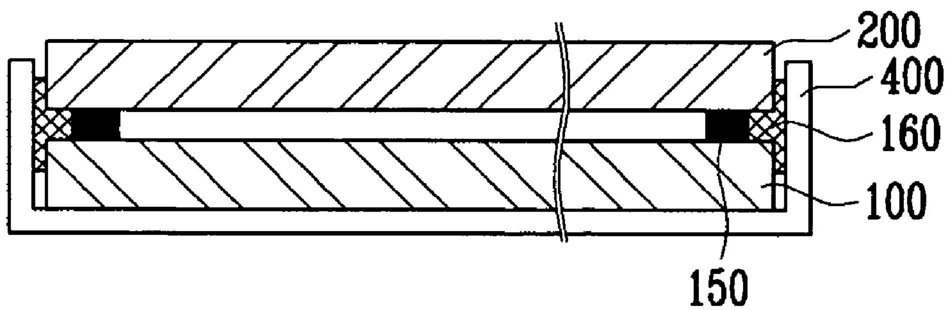

Next, a curable material for forming a reinforcement material 160 is applied, for example by using a dispenser, in an inner wall surface of a bracket 400 for mounting an organic light-emitting panel including the substrate 100 and the encapsulation substrate 200, both attached to each other. Generally, metal materials are mainly used for the bracket 400, although not limited thereto, and plastics are also used for the bracket 400. In an embodiment, the curable material for forming the reinforcement material 160 is preferably applied at a liquid state. (FIG. 4*d*)

Next, the organic light-emitting panel or device is mounted on the bracket 400. In an embodiment, the organic light-emitting panel contacts the curable material for the reinforcement material 160 applied in the inner surface of the bracket 400 while it is mounted on the bracket 400, and then the curable material for the reinforcement material 160 moves into a gap between the substrate 100 and the encapsulation substrate 200. (FIG. 4*e*) In an embodiment, gaps are generated in the edge regions of the substrate 100 and the encapsulation substrate 200 since the frit 150 is not formed adjacent to the edges, but formed spaced apart at a predetermined distance from the edges. Accordingly, the curable material for the reinforcement material 160 moves into the gaps in the edge regions, and then cured. In an embodiment, the dimension of the gap between the substrate 100 and the encapsulation substrate 200 will be identical to the height of the frit, and if a liquid of the reinforcement material is applied on the edges, then the liquid moves into gaps by a capillary phenomenon, and then cured.

Meanwhile, if the materials of the reinforcement material 160 are naturally cured, then preparation of an organic light-emitting diode may be completed without an additional process, but if the materials of the reinforcement material 160 are UV-cured, then there is required an additional process for masking the reinforcement material 160 and irradiating it with UV ray, and if the materials of the reinforcement material 160 are thermally cured, then there is required an additional process for subjecting the heat to the reinforcement material The present invention has been described in detail with reference to embodiments. However, it would be appreciated that modifications and changes might be made in these embodiments without departing from the principles and spirit of the invention. For example, an encapsulation substrate may be prepared in a cap shape, and changes may be easily made in materials of a bracket or frame.

Although a few embodiments of the present invention have been shown and described, it would be appreciated by those skilled in the art that changes might be made in this embodiment without departing from the principles and spirit of the present invention, the scope of which is defined in the claims and their equivalents.

What is claimed is:

1. An organic light-emitting display device, comprising:
an organic light-emitting display unit comprising:
a front substrate comprising a front surface and a first side surface,
a rear substrate comprising a rear surface and a first side surface, the rear substrate opposing the front substrate,
an array of organic light-emitting pixels interposed between the front and rear substrates,
a frit seal interposed between the front substrate and the rear substrate while surrounding the array, wherein the frit seal, the front substrate and the rear substrate together define an enclosed space in which the array is located, the frit seal comprising a first side surface, and
a first side comprising the first side surfaces of the front substrate, the rear substrate and the frit seal;
a bracket comprising a first surface generally opposing the first side of the unit and connected to the first side of the unit; and
a first structure interconnecting the first surface of the bracket and the first side of the unit.

2. The device of claim 1, wherein the first structure is formed in substantially the entire area between the first surface of the bracket and the first side of the unit.

3. The device of claim 1, wherein the first structure is formed on substantially throughout the first surface of the bracket.

4. The device of claim 1, wherein the first structure is bonded to the first surface of the bracket and bonded to either or both of the first side surfaces of the front and rear substrates.

5. The device of claim 1, wherein the first structure is bonded to the first side surface of the frit seal.

6. The device of claim 1, wherein the bracket further comprises a rear wall opposing the rear substrate.

7. The device of claim 6, wherein the rear wall of the bracket is bonded to the rear surface of the rear substrate.

8. The device of claim 1, wherein the bracket comprises a rear wall opposing the rear substrate, and the bracket further comprises a plurality of side walls extending from the rear wall at an angle, and wherein a first one of the plurality of the side walls provides the first surface opposing the first side of the unit.

9. The device of claim 8, wherein the first side wall extends substantially parallel to at least one of the first side surfaces of the front and rear substrates.

10. The device of claim 8, wherein the first side wall covers substantially the entirety of the first side of the unit.

11. The device of claim 8, wherein the first side wall does not cover at least part of the first side surface of the front substrate while generally opposing the first side of the unit.

12. The device of claim 8, wherein the first side wall does not cover the first side surface of the front substrate while generally opposing the first side of the unit.

13. The device of claim 1, wherein the structure comprises a layer comprising a polymeric material.

14. The device of claim 1, wherein the unit further comprises a plurality additional sides, wherein the bracket comprises a first side wall and a plurality of additional side walls, the first side wall providing the first surface of the frame, wherein each of the plurality of additional side walls of the bracket comprises a surface generally opposing one of the plurality of additional sides of the unit, wherein the device further comprises a plurality of additional structures, each of which interconnects one of the plurality of additional side walls and one of the plurality of additional sides of the unit.

15. The device of claim 14, wherein the first side wall and the plurality of additional side walls form a closed loop surrounding the first side and the plurality of additional sides of the unit.

16. The device of claim 1, wherein the front substrate further comprises a second side surface, wherein the rear substrate further comprises a second side surface, wherein the frit seal further comprises a second side surface, wherein the second side surfaces of the front substrate, the second substrate and the frit seal generally face the same direction, wherein the unit further comprises a second side comprising a second side surface of the front substrate, a second side surface of the rear substrate and a second side surface of the frit seal, wherein the bracket further comprises a second surface generally opposing the second side of the device, and wherein the unit further comprises a second structure interconnecting the second side of the unit and the second surface of the frame.

17. The device of claim 16, wherein the first and second structures are integrated.

18. The device of claim 16, wherein the first and second structures are separated.

19. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($W0_3$), bismuth oxide ($Bi_2O_3$), antimony oxide ($Sb_2O_3$), lead-borate glass, tin-phosphate glass, vanadate glass, and borosilicate.

20. A method of making an organic light-emitting display device, the method comprising:

providing a device comprising:

a front substrate comprising a front surface and a first side surface, a rear substrate comprising a rear surface and a first side surface, the rear substrate opposing the front substrate, an array of organic light-emitting pixels interposed between the front and rear substrates, a frit seal interposed between the front substrate and the rear substrate while surrounding the array, wherein the frit seal, the front substrate and the rear substrate together define an enclosed space in which the array is located, the frit seal comprising a first side surface, and a first side comprising the first sides of the front substrate, the rear substrate and the frit seal;

placing a bracket comprising a first surface so as to generally oppose the first side of the device; and forming a structure between and interconnecting the first surface of the bracket and the first side of the device.

21. The method of claim 20, wherein the method further comprises forming a curable material on the first surface of the frame, and wherein placing the bracket comprises arranging the bracket with respect to the device such that the curable material contacts the first side of the device.

22. The method of claim 21, wherein the method further comprises curing the curable material, thereby forming the structure.

23. The method of claim 21, wherein a viscosity of the curable material is less than about 5000 cP.

24. The method of claim 20, wherein the bracket further comprises a rear wall, and wherein placing the bracket further comprises arranging the rear wall so as to oppose the rear substrate.

25. An organic light-emitting display device, comprising:

an organic light-emitting display unit comprising:

a front substrate comprising a front surface and a first side surface, a rear substrate comprising a rear surface and a first side surface, the rear substrate opposing the front substrate, an array of organic light-emitting pixels interposed between the front and rear substrates, a frit seal interposed between the front substrate and the rear substrate while surrounding the array, wherein the frit seal, the front substrate and the rear substrate together define an enclosed space in which the array is located, the frit seal comprising a first side surface, and a first side comprising the first side surfaces of the front substrate, the rear substrate and the frit seal;

a bracket comprising a first surface generally opposing the first side of the unit and connected to the first side of the unit; and a first structure interconnecting the first surface of the bracket and the first side of the unit;

wherein the front substrate, the rear substrate and the first side surface of the frit seal define a gap space, and wherein the first structure comprises a portion extending into the gap space and interposed between the front and rear substrates.

* * * * *

UNITED STATES PATENT AND TRADEMARK OFFICE

CERTIFICATE OF CORRECTION

PATENT NO. : 7,944,143 B2
APPLICATION NO. : 11/540151
DATED : May 17, 2011
INVENTOR(S) : Choi et al.

It is certified that error appears in the above-identified patent and that said Letters Patent is hereby corrected as shown below:

| Issued Patent Column | Line | Description of Discrepancy |
|---|---|---|
| Title Page 1 (Item 56) References Cited Column 1 | 22 | Delete duplicate "JP 2005 251415 9/2005" |
| Title Page 1 (Item 56) Col. 2 | 2 | Add reference to Issued Patent. "4,238,704" |
| Title Page 1 (Item 57) Abstract | 7 | After "attached" insert --to--. |
| Title Page 1 (Item 57) Abstract | 8 | After "to" insert --the--. |
| Title Page 1 (Item 57) Abstract | 8 | After "inside" insert --of--. |
| Title Page 1 (Item 57) Abstract | 9 | After "then" insert --is--. |

Signed and Sealed this
Twentieth Day of March, 2012

David J. Kappos

David J. Kappos
*Director of the United States Patent and Trademark Office*

| | | |
|---|---|---|
| Title Page 2 (Item 56) Col. 1 | 12 | Add reference to Issued Patent. "6,555,025" |
| Title Page 2 (Item 56) Col. 2 | 58 | Add reference to Issued Patent. "JP 09-278483" |
| Title Page 3 (Item 56) Col. 2 | 17 | Under Other Publications, change "releveant" to --relevant--. |
| Title Page 4 (Item 56) Col. 1 | 25 | Under Other Publications, change "revelant" to --relevant--. |
| Title Page 4 (Item 56) Col. 1 | 25 | Under Other Publications, change "documents." to --documents, Jul. 26, 2007, Lee et al.-- |
| Title Page 4 (Item 56) Col. 1 | 29 | Under Other Publications, change "revelant" to --relevant--. |
| Title Page 4 (Item 56) Col. 1 | 29 | Under Other Publications, change "documents." to --documents, Jul. 26, 2007, Lee et al.--. |
| Title Page 4 (Item 56) Col. 1 | 33 | Under Other Publications, change "revelant" to --relevant--. |
| Title Page 4 (Item 56) Col. 1 | 33 | Under Other Publications, change "documents." to --documents, Jul. 27, 2007, Choi et al.--. |
| Title Page 4 (Item 56) Col. 1 | 37 | Under Other Publications, change "revelant" to --relevant--. |
| Title Page 4 (Item 56) Col. 1 | 37 | Under Other Publications, change "documents." to --documents, Jul. 27, 2007, Choi et al.--. |

| | | |
|---|---|---|
| Title Page 4 (Item 56) Col. 1 | 41 | Under Other Publications, change "revelant" to --relevant--. |
| Title Page 4 (Item 56) Col. 1 | 41 | Under Other Publications, change "documents." to --documents, Jul. 26, 2007, Choi et al.--. |
| Title Page 4 (Item 56) Col. 1 | 45 | Under Other Publications, change "revelant" to --relevant--. |
| Title Page 4 (Item 56) Col. 1 | 45 | Under Other Publications, change "documents." to --documents, Jul. 26,2007, Choi et al.--. |
| Title Page 4 (Item 56) Col. 1 | 49 | Under Other Publications, change "revelant" to --relevant--. |
| Title Page 4 (Item 56) Col. 1 | 49 | Under Other Publications, change "documents." to --documents, Jul. 26, 2007, Choi et al.--, |
| Title Page 4 (Item 56) Col. 1 | 53 | Under Other Publications, change "revelant" to --relevant--. |
| Title Page 4 (Item 56) Col. 1 | 53 | Under Other Publications, change "documents." to --documents, Jul. 26, 2007, Choi et al.--. |
| Title Page 4 (Item 56) Col. 2 | 2 | Under Other Publications, change "revelant" to --relevant--. |
| Title Page 4 (Item 56) Col. 2 | 2 | Under Other Publications, change "documents." to --documents, Jul. 26, 2007, Choi et al.--. |
| Title Page 4 (Item 56) Col. 2 | 6 | Under Other Publications, change "revelant" to --relevant--. |

| | | |
|---|---|---|
| Title Page 4 (Item 56) Col. 2 | 6 | Under Other Publications, change "documents." to --documents, Jul. 26, 2007, Choi et al.--. |
| Title Page 4 (Item 56) Col. 2 | 10 | Under Other Publications, change "revelant" to --relevant--. |
| Title Page 4 (Item 56) Col. 2 | 10 | Under Other Publications, change "documents." to --documents, Jul. 26, 2007, Lee et al.--. |
| Title Page 4 (Item 56) Col. 2 | 14 | Under Other Publications, change "revelant" to --relevant--. |
| Title Page 4 (Item 56) Col. 2 | 14 | Under Other Publications, change "documents." to --documents, Jul. 26, 2007, Choi.--. |
| Title Page 4 (Item 56) Col. 2 | 18 | Under Other Publications, change "revelant" to --relevant--. |
| Title Page 4 (Item 56) Col. 2 | 18 | Under Other Publications, change "documents." to --documents, Jul. 26, 2007, Choi et al.--. |
| Title Page 4 (Item 56) Col. 2 | 22 | Under Other Publications, change "revelant" to --relevant--. |
| Title Page 4 (Item 56) Col. 2 | 22 | Under Other Publications, change "documents." to --documents, Aug. 2, 2007, Park.--. |
| Title Page 4 (Item 56) Col. 2 | 26 | Under Other Publications, change "revelant" to --relevant--. |
| Title Page 4 (Item 56) Col. 2 | 26 | Under Other Publications, change "documents." to --documents, Aug. 2, 2007, Lee.--. |

| | | |
|---|---|---|
| Title Page 4 (Item 56) Col. 2 | 44 | Under Other Publications, change "revelant" to --relevant--. |
| Title Page 4 (Item 56) Col. 2 | 44 | Under Other Publications, change "documents." to --documents, Aug. 23, 2007, Lee.--. |
| Title Page 4 (Item 56) Col. 2 | 48 | Under Other Publications, change "revelant" to --relevant--. |
| Title Page 4 (Item 56) Col. 2 | 48 | Under Other Publications, change "documents." to --documents, Oct. 4, 2007, Park.--. |
| Title Page 4 (Item 56) Col. 2 | 52 | Under Other Publications, change "revelant" to --relevant--. |
| Title Page 4 (Item 56) Col. 2 | 52 | Under Other Publications, change "documents." to --documents, Mar. 27, 2008, Wang et al.--. |
| 1 | 36 (Approx.) | Change "STURUTURE" to --STRUCTURE--. |
| 1 | 39 (Approx.) | Change "STURUTURE" to --STRUCTURE--. |
| 1 | 56 (Approx.) | Change "METHOD OF FABRICATING" to --FABRICATING METHOD OF--. |
| 1 | 58 (Approx.) | Change "DEVICE METHOD OF FABRICATING" to --AND METHOD OF FABRICATING--. |
| 3 | 7 | After "plurality" insert --of--. |
| 11 | 65 | Change "116a,116b" to --116a, 116b--. |
| 12 | 2 | Change " 116a,116b" to --116a, 116b--. |
| 14 | 23 | Change "material" to --material.--. |
| 15 | 30 | In Claim 14, after "plurality" insert --of--. |

| | | |
|---|---|---|
| 16 | 3 | In Claim 19, change "($W0_3$)," to --($WO_3$),--. |